(12) United States Patent
Matsushima et al.

(10) Patent No.: US 7,579,692 B2
(45) Date of Patent: *Aug. 25, 2009

(54) METHOD FOR FORMING A BUMP, SEMICONDUCTOR DEVICE AND METHOD OF FABRICATING SAME, SEMICONDUCTOR CHIP, CIRCUIT BOARD, AND ELECTRONIC INSTRUMENT

(75) Inventors: Fumiaki Matsushima, Chino (JP); Tsutomu Ota, Chino (JP); Akira Makabe, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/980,126

(22) Filed: Oct. 30, 2007

(65) Prior Publication Data

US 2008/0073783 A1    Mar. 27, 2008

Related U.S. Application Data

(62) Division of application No. 11/009,995, filed on Dec. 10, 2004, now Pat. No. 7,355,280, which is a division of application No. 09/945,241, filed on Aug. 31, 2001, now abandoned.

(30) Foreign Application Priority Data

Sep. 4, 2000    (JP) .............................. 2000-267076

(51) Int. Cl.
*H01L 23/48* (2006.01)
(52) U.S. Cl. .................... 257/738; 257/737; 257/773; 257/E23.021; 257/E23.069

(58) Field of Classification Search ................. 257/737, 257/738, 772, 779, E23.015, E23.02, E23.23–E23.079; 438/613–617; 228/180.22
See application file for complete search history.

(56) References Cited

U.S. PATENT DOCUMENTS

| 4,205,099 A | 5/1980 | Jones et al. |
| 4,935,803 A | 6/1990 | Kalfus et al. |
| 5,130,275 A | 7/1992 | Dion |
| 5,310,699 A | 5/1994 | Chikawa et al. |
| 5,329,423 A | 7/1994 | Scholz |

(Continued)

FOREIGN PATENT DOCUMENTS

EP    0 766 310 A2    2/1997

(Continued)

OTHER PUBLICATIONS

Communication from Chinese Patent Office re: counterpart application.

(Continued)

*Primary Examiner*—Jasmine J Clark
(74) *Attorney, Agent, or Firm*—Harness, Dickey & Pierce, P.L.C.

(57) ABSTRACT

A method for forming a bump includes the steps of forming a resist layer so that a through-hole formed therein is located on a pad; and forming a metal layer to be electrically connected to the pad conforming to the shape of the through-hole. The metal layer is formed so as to have a shape in which is formed a region for receiving a soldering or brazing material.

8 Claims, 13 Drawing Sheets

U.S. PATENT DOCUMENTS

| | | | |
|---|---|---|---|
| 5,349,495 A * | 9/1994 | Visel et al. | 361/774 |
| 5,477,086 A | 12/1995 | Rostoker et al. | |
| 5,600,180 A | 2/1997 | Kusaka et al. | |
| 5,965,943 A | 10/1999 | Mizuta | |
| 6,093,964 A | 7/2000 | Saitoh | |
| 6,130,148 A | 10/2000 | Earnworth et al. | |
| 6,191,023 B1 | 2/2001 | Chen | |
| 6,218,281 B1 | 4/2001 | Watanabe et al. | |
| 6,414,849 B1 | 7/2002 | Chiu | |
| 6,525,422 B1 | 2/2003 | Ono et al. | |
| 6,570,251 B1 | 5/2003 | Akram et al. | |
| 6,612,024 B1 | 9/2003 | Sasaki et al. | |
| 7,355,280 B2 * | 4/2008 | Matsushima et al. | 257/738 |

FOREIGN PATENT DOCUMENTS

| | | |
|---|---|---|
| JP | 58-51512 | 3/1983 |
| JP | 60-031245 | 2/1985 |
| JP | 01-191451 | 8/1989 |
| JP | 05-013418 | 1/1993 |
| JP | 05-335315 | 12/1993 |
| JP | 6-140409 | 5/1994 |
| JP | 07-066207 | 3/1995 |
| JP | 09-017795 | 1/1997 |
| JP | 9-97791 | 4/1997 |
| JP | 10-50708 | 2/1998 |

OTHER PUBLICATIONS

Communication from Japanese Patent Office re: counterpart application.

* cited by examiner

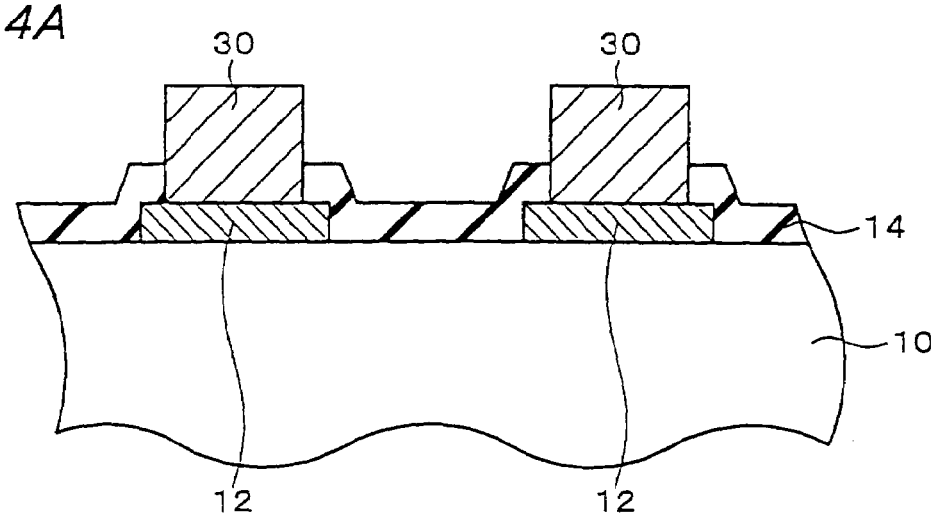
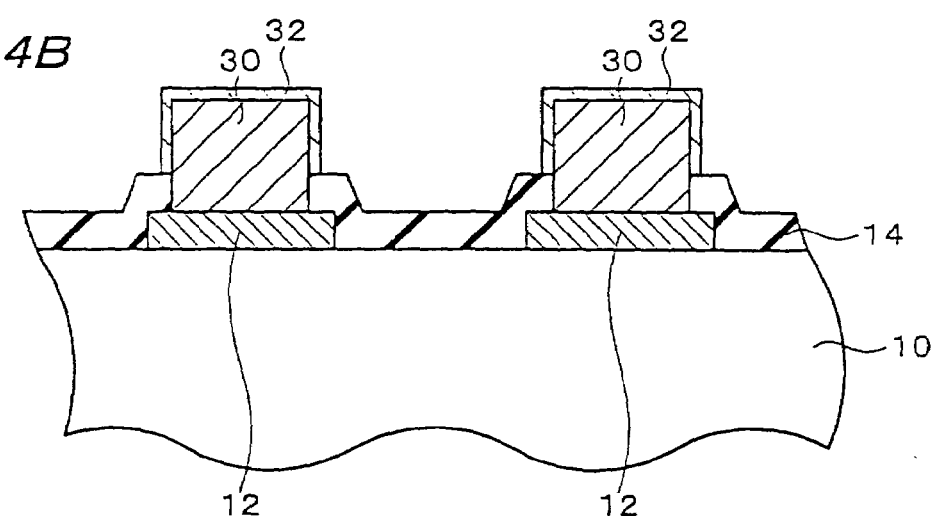
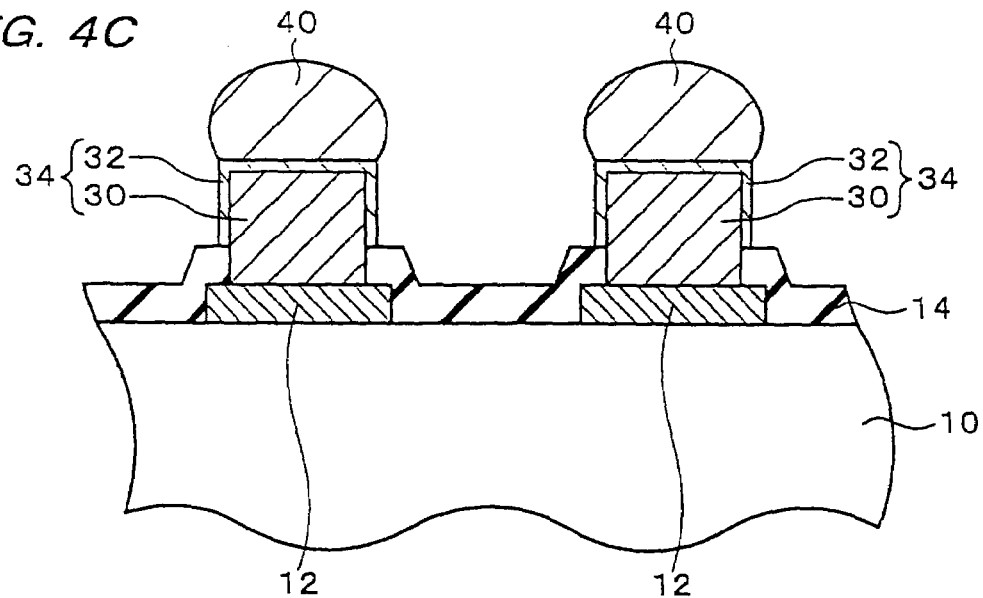

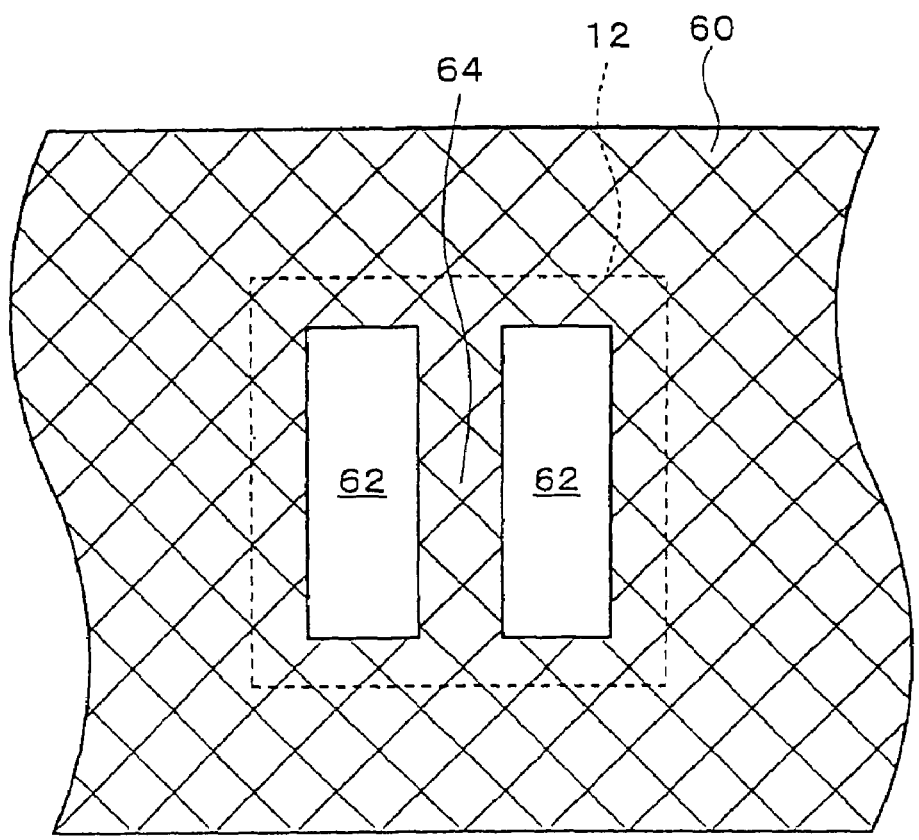

METHOD FOR FORMING A BUMP, SEMICONDUCTOR DEVICE AND METHOD OF FABRICATING SAME, SEMICONDUCTOR CHIP, CIRCUIT BOARD, AND ELECTRONIC INSTRUMENT

This application is a divisional of U.S. patent application Ser. No. 11/009,995 filed Dec. 10, 2004, which is a divisional of U.S. patent application Ser. No. 09/945,241 filed Aug. 31, 2001, claiming priority to Japanese Patent Application No. 2000-267076, filed Sep. 4, 2000, all of which are hereby incorporated by reference.

TECHNICAL FIELD

The present invention relates to a method for forming a bump, a semiconductor device and a method of fabricating the same, a semiconductor chip, a circuit board, and an electronic instrument.

BACKGROUND

A method is known in the art in which metal bumps are formed on pads of a semiconductor chip by applying electroless plating or the like. The semiconductor chip is electrically connected to an interconnect pattern (leads) on a substrate by allowing solder applied to the metal bumps to melt, for example. According to this method, the pads can be connected to the leads by melting the solder, differing from the case of connecting the pads to the leads by applying heat and pressure to the leads, thereby decreasing the amount of pressure applied to the surface of the semiconductor chip. This allows the pads to be disposed not only in the end sections of the semiconductor chip but also in a device formation region, whereby a larger number of pads can be disposed at a coarser pitch. Moreover, use of solder ensures that a semiconductor device can be fabricated at low cost in comparison with the case of forming gold bumps.

However, according to this configuration, solder applied to each pad may flow onto the adjacent pads upon melting when connecting the pads to the interconnect pattern, thereby causing a short circuit to occur between the pads. This problem cannot be solved by merely decreasing the amount of solder applied to each pad.

SUMMARY

A method for forming a bump according to the first aspect of the present invention comprises the steps of:
    forming a resist layer so that a through-hole formed therein is located on a pad; and
    forming a metal layer to be electrically connected to the pad conforming to the shape of the through-hole,
    wherein the metal layer is formed so as to have a shape in which is formed a region for receiving a soldering or brazing material.

A method of fabricating a semiconductor device according to the second aspect of the present invention comprises the steps of:
    bonding a plurality of metal layers to a plurality of leads through a soldering or brazing material, each of the metal layers formed on each of a plurality of pads of a semiconductor chip, each of the metal layers having a shape in which is formed a region for receiving the soldering or brazing material,
    wherein the soldering or brazing material, when melted, is allowed to flow into the region of each of the metal layers for receiving the soldering or brazing material so as not to spread onto an adjacent pad of the plurality of pads.

A semiconductor device according to the third aspect of the present invention is fabricated by the above method of fabricating a semiconductor device.

A semiconductor chip according to the fourth aspect of the present invention comprises a plurality of pads, and a metal layer disposed on each of the pads which is formed to have a shape in which is formed a region for receiving a soldering or brazing material.

A semiconductor device according to the fifth aspect of the present invention comprises:
    a semiconductor chip having a plurality of pads;
    a metal layer disposed on each of the pads, the metal layer formed to have a shape in which is formed a region for receiving a soldering or brazing material; and
    a plurality of leads,
    wherein the metal layer is bonded to one of the leads through the soldering or brazing material, and part of the soldering or brazing material is put in the region for receiving the soldering or brazing material.

According to the sixth aspect of the present invention, there is provided a circuit board on which the above semiconductor device is mounted.

An electronic instrument according to the seventh aspect of the present invention comprises the above semiconductor device.

BRIEF DESCRIPTION OF THE DRAWINGS

FIGS. 4A to 4C are views showing the method for forming bumps according to the first embodiment to which the present invention is applied.

FIG. 8 is a view showing a method for forming bumps according to a second embodiment to which the present invention is applied.

DETAILED DESCRIPTION

Figure 1:
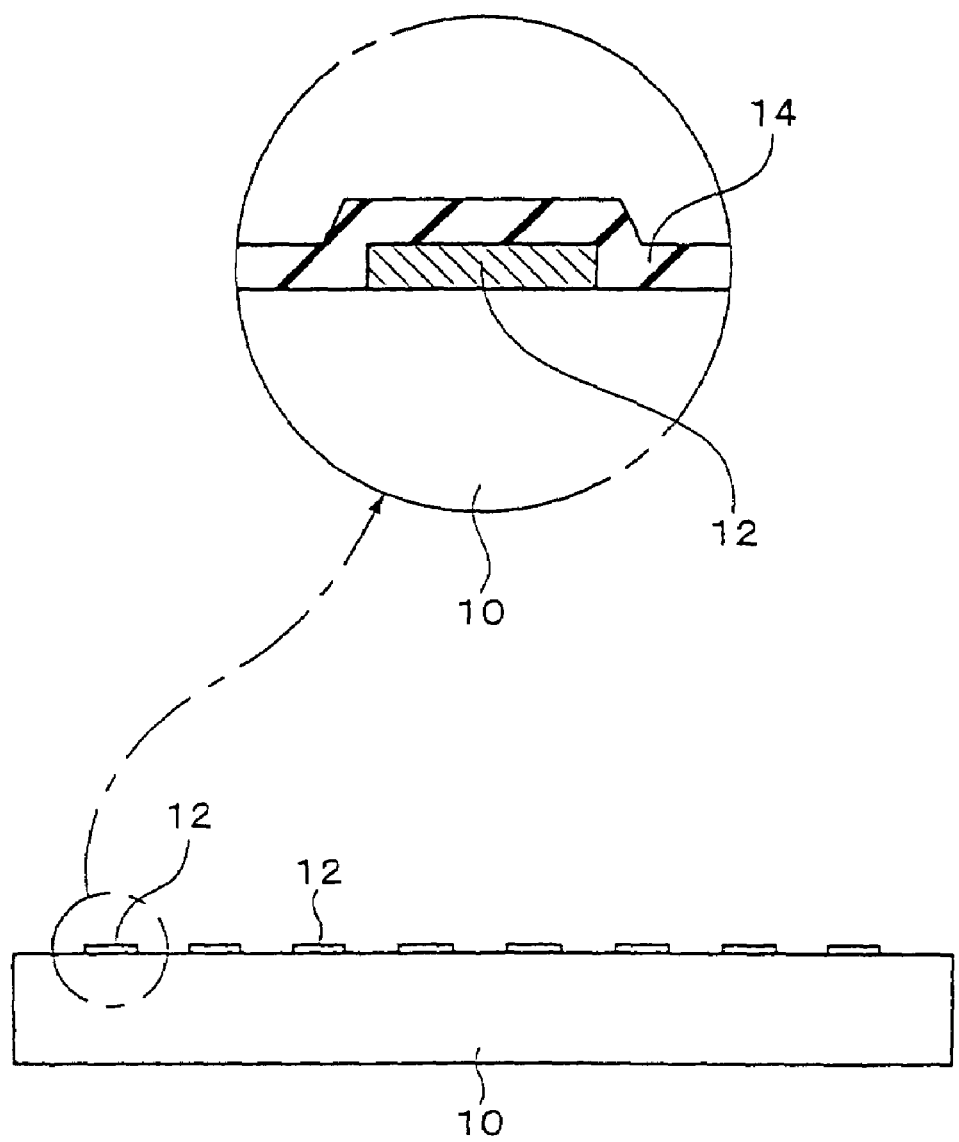
FIG. 1 is a view showing a method for forming bumps according to a first embodiment to which the present invention is applied.

The embodiment of the present invention has been achieved to solve the above conventional problem. An object of the embodiment of the present invention is to provide a method for forming a bump capable of dealing with a fine pitch with high reliability, a semiconductor device and a method of fabricating the same, a semiconductor chip, a circuit board, and an electronic instrument.

(1) A method for forming a bump according to one embodiment of the present invention comprises the steps of:

forming a resist layer so that a through-hole formed therein is located on a pad; and forming a metal layer to be electrically connected to the pad conforming to the shape of the through-hole, wherein the metal layer is formed so as to have a shape in which is formed a region for receiving a soldering or brazing material.

According to this embodiment of the present invention, the metal layers are formed into a specific shape conforming to the shape of the through-holes. The metal layers have a region for receiving the brazing material. This allows the brazing material to flow into the above region of the metal layers, thereby preventing the brazing material from spreading outside the metal layers. Specifically, the brazing material melted on the metal layers can be prevented from flowing onto the adjacent pads, for example. Therefore, occurrence of a short circuit between the pads can be prevented, whereby the yield in the fabrication can be increased.

(2) In this method for forming a bump, the resist layer may be formed so as to have a projection on the inner side of the through-hole.

This enables the formation of depressions in the sides of the metal layers. This allows the brazing material to flow into the depressions of the metal layers, thereby preventing the brazing material from spreading outside the metal layers.

(3) In this method for forming a bump, the resist layer may be formed so that part of the resist layer remains at the center of the through-holes.

This enables the formation of the region for receiving the brazing material at the center of the metal layers. This allows the brazing material to flow into the region at the center of the metal layers, thereby preventing the brazing material from spreading outside the metal layers.

(4) In this method for forming a bump, a plurality of the through-holes may be formed in the resist layer so that at least a part of each of the through-holes is superposed on the pad, and a plurality of the metal layers may be formed, each of the plurality of the metal layers conforming to each of the through-holes to form the region for receiving the soldering or brazing material between the adjacent metal layers of the plurality of the metal layers on the pad.

This prevents the brazing material from spreading outside the metal layers by allowing the brazing material to flow into the region formed between the adjacent metal layers on each pad.

(5) In this method for forming a bump, the metal layer may comprise first and second metal layers, wherein the first metal layer may be formed in a state in which the resist layer is formed, and the second metal layer may be formed on the first metal layer.

In the case where a material to which the brazing material readily adheres in comparison with the first metal layers is used as the material for the second metal layers, the brazing material can be applied only to the upper surface of the metal layers. Specifically, this prevents the brazing material from spreading outside the metal layers more reliably.

(6) In this method for forming a bump, the metal layer may comprise first and second metal layers, wherein the first metal layer may be formed in a state in which the resist layer is formed, and after removing the resist layer, the second metal layer may be formed so as to cover a surface of the first metal layer.

This prevents the surface of the first metal layer from being oxidized.

(7) In this method for forming a bump, the pad may be covered with an insulating film, the resist layer may be formed on the insulating film, an opening for exposing at least part of the pad may be formed in the insulating film after forming the through-hole in the resist layer, and the first metal layer may be formed on the pad in a state in which the resist layer is formed.

Since the openings are formed in the insulating film and the first metal layers to be electrically connected to the pads are formed using the through-holes in the same resist layer, the bumps can be formed by simplified steps.

(8) In this method for forming a bump, the first and second metal layers may be formed by electroless plating.

(9) In this method for forming a bump, the first metal layer may be formed of a material containing nickel.

(10) In this method for forming a bump, the second metal layers may be formed using a material containing gold.

(11) A method of fabricating a semiconductor device according to another embodiment of the present invention comprises the steps of:

bonding a plurality of metal layers to a plurality of leads through a soldering or brazing material, each of the metal layers formed on each of a plurality of pads of a semiconductor chip, each of the metal layers having a shape in which is formed a region for receiving the soldering or brazing material, wherein the soldering or brazing material, when melted, is allowed to flow into the region of each of the metal layers for receiving the soldering or brazing material so as not to spread onto an adjacent pad of the plurality of pads.

According to this embodiment of the present invention, the brazing material applied between the metal layers and the leads is allowed to flow into the region of the metal layer, thereby preventing the brazing material from spreading outside the metal layers. Specifically, the brazing materials melted on the metal layers can be prevented from flowing onto the adjacent pads. Therefore, occurrence of a short circuit between the pads can be prevented, whereby the yield in the fabrication can be increased.

(12) In this method of fabricating a semiconductor device, at least one depression may be formed in a side of one of the metal layers, and the soldering or brazing material may be allowed to flow into the depression.

This prevents the brazing material from spreading outside the metal layers by allowing the brazing material to flow into the depression of the metal layers.

(13) In this method of fabricating a semiconductor device, one of the metal layer may be formed so that a depression which is provided in the direction of the height of the metal layers is formed at the center, and the soldering or brazing material may be allowed to flow into the depression.

This prevents the brazing material from spreading outside the metal layers by allowing the brazing material to flow into the depression which is provided in the direction of the height of the metal layers.

(14) In this method of fabricating a semiconductor device, two or more metal layers of the plurality of metal layers may be formed so as to be connected to one of the pads, and the soldering or brazing material may be allowed to flow into a region formed between the adjacent metal layers of the plurality of metal layers on one of the pads.

This prevents the brazing material from spreading outside the metal layers by allowing the brazing material to flow into the region formed between the adjacent metal layers on each pad.

(15) A semiconductor device according to an embodiment of the present invention is fabricated by the above method of fabricating a semiconductor device.

(16) A semiconductor chip according to further embodiment of the present invention comprises a plurality of pads, and a metal layer disposed on each of the pads which is formed to have a shape in which is formed a region for receiving a soldering or brazing material.

(17) In this semiconductor chip, at least one depression may be formed in a side of the metal layer.

(18) In this semiconductor chip, a depression which is provided in the direction of the height of the metal layers may be formed at the center of the metal layers.

(19) In this semiconductor chip, two or more the metal layers may be formed on one of the pads.

(20) A semiconductor device according to still another embodiment of the present invention comprises:

a semiconductor chip having a plurality of pads;

a metal layer disposed on each of the pads, the metal layer formed to have a shape in which is formed a region for receiving a soldering or brazing material; and a plurality of leads, wherein the metal layer is bonded to one of the leads through the soldering or brazing material, and part of the soldering or brazing material is put in the region for receiving the soldering or brazing material.

According to this embodiment of the present invention, the brazing material can be prevented from spreading outside the metal layer by allowing part of the brazing material to flow into the region of the metal layers. Specifically, the brazing material melted on the metal layers can be prevented from flowing onto the adjacent pads. Therefore, a highly reliable semiconductor device can be provided by preventing occurrence of a short circuit between the pads.

(21) In this semiconductor device, at least one depression may be formed in a side of the metal layer, and the soldering or brazing material may be put in the depression.

(22) In this semiconductor device, a depression which is provided in the direction of the height of the metal layer may be formed at the center of the metal layer, and the soldering or brazing material may be put in the depression.

(23) In this semiconductor device, two or more the metal layers may be formed on one of the pads, and the soldering or brazing material may be put in a region formed between adjacent metal layers of the two or more the metal layers on one of the pads.

(24) According to still another embodiment of the present invention, there is provided a circuit board on which the above semiconductor device is mounted.

(25) An electronic instrument according to yet another embodiment of the present invention comprises the above semiconductor device.

Preferred embodiments of the present invention are described below with reference to the drawings. However, the present invention is not limited to the following embodiments.

FIRST EMBODIMENT

FIGS. 1 to 6C are views showing a method for forming bumps according to a first embodiment to which the present invention is applied. The present embodiment illustrates an example in which bumps are formed on a semiconductor chip. However, the method for forming bumps according to the present invention is not limited thereto. The method may be applied for forming bumps on leads. The leads may be an interconnect pattern formed on a substrate. In this case, lands of the interconnect pattern correspond to pads. The present invention may be applied when forming bumps on pads formed on a semiconductor wafer.

In the present embodiment, a semiconductor chip 10 shown in FIG. 1 is provided. The semiconductor chip 10 is generally formed in the shape of a rectangular parallelepiped (including cube). The semiconductor chip 10 may be formed in the shape of a sphere, for example. The thickness of the semiconductor chip 10 is not limited. The semiconductor chip 10 ground into a thin piece may be used.

The semiconductor chip 10 includes a plurality of pads 12. The pads 12 become electrodes for an integrated circuit formed inside the semiconductor chip 10. The pads 12 are generally formed on the side of the semiconductor chip 10 on which the integrated circuit is formed. In this case, the pads 12 may be formed either outside or inside the region in which the integrated circuit is formed. The pads 12 are formed in one or more of columns at the ends or center of the semiconductor chip 10. The pads 12 may be arranged in a matrix of a plurality of rows and columns on the surface of the semiconductor chip 10.

The planar shape of the pads 12 may be either rectangular or circular. The pads 12 are generally formed using a material containing aluminum. The pads 12 may be formed using a material containing copper or the like.

An insulating film 14 is formed on the surface of the semiconductor chip 10 on which the pads 12 are formed. In the present embodiment, the insulating film 14 is formed so as to cover each pad 12, as shown in FIG. 1. Specifically, the semiconductor chip 10 in which each pad 12 is not exposed through the insulating film 14 may be used. In the present embodiment, bumps are formed on the pads 12 using a resist layer formed to allow each pad 12 to be exposed through the insulating film 14.

The insulating film 14 is formed of either a single layer or a plurality of layers. The thickness of the insulating film 14 is not limited. The insulating film 14 may be referred to as a passivation film. The insulating film 14 is formed using $SiO_2$, SiN, a polyimide resin, or the like.

A method of fabricating a semiconductor device according to the present embodiment includes the following steps using the semiconductor chip 10. The following description is also applicable to semiconductor wafer processing.

Figure 2:
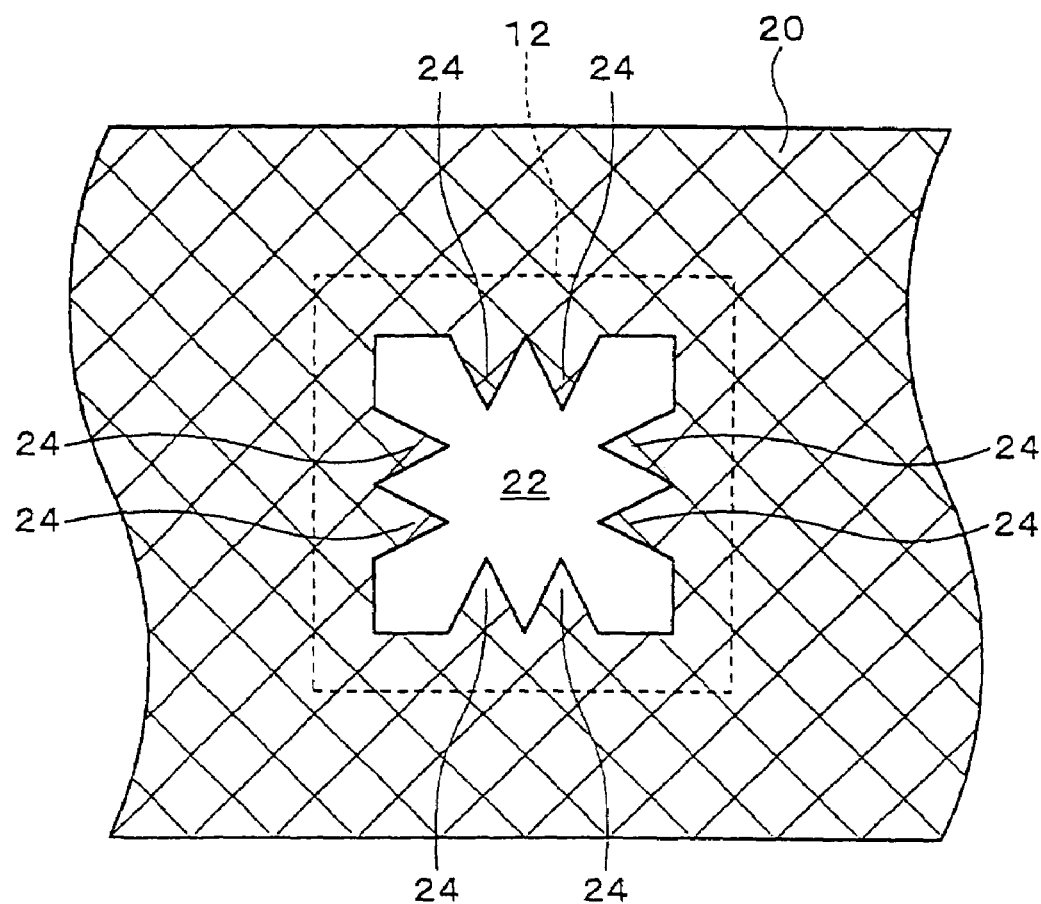
FIG. 2 is a view showing the method for forming bumps according to the first embodiment to which the present invention is applied.
Figure 3A:
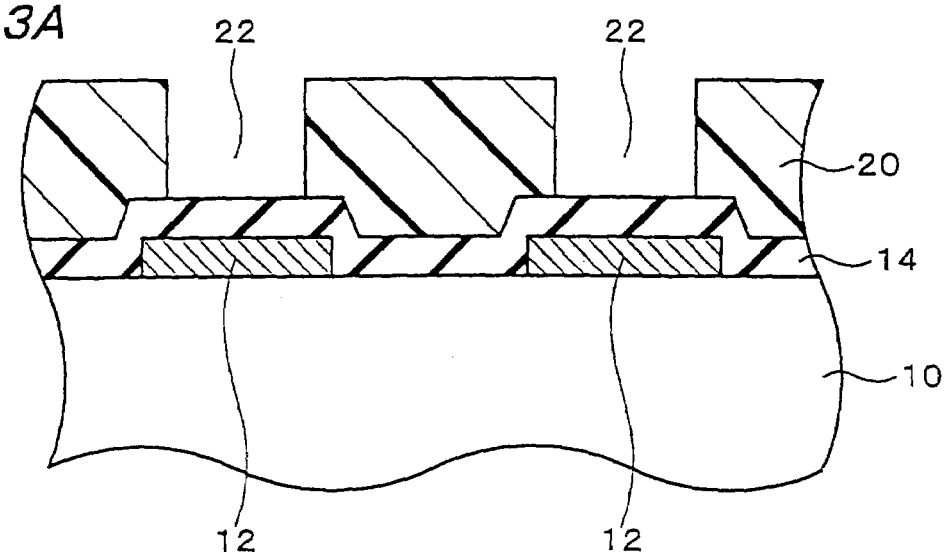
FIGS. 3A to 3C are views showing the method for forming bumps according to the first embodiment to which the present invention is applied.

A resist layer 20 is formed on the semiconductor chip 10, as shown in FIGS. 2 and 3A. FIG. 2 is a plan view and FIG. 3 is a cross-sectional view showing the semiconductor chip 10. The resist layer 20 is formed on the surface of the semiconductor chip 10 on which the pads 12 are formed, specifically, on the insulating film 14. The thickness of the resist layer 20 may be appropriately determined depending on the height of bumps which are formed later. The resist layer 20 may be formed to a thickness of about 20 µm, for example.

The resist layer 20 has through-holes 22 formed therein above the pads 12, specifically, on the insulating film 14. Specifically, the through-holes 22 are formed so that at least part (part or all) of the through-holes 22 is superposed on the pads 12. Allowing part of the through-holes 22 to be superposed on the pads 12 enables the bumps formed in the through-holes 22 to be electrically connected to the pads 12.

In the present embodiment, the through-holes 22 are formed so that projections are formed on the inner side of the through-holes 22, as shown in FIG. 2. In other words, a plurality of projections is formed on the wall surface of the resist layer 20 in contact with the through-holes 22. One or a plurality of projecting sections 24 is formed on the resist layer 20. The planar shape of the through-holes 22 may be similar to the shape of the pads 12, wherein part of the resist layer 20 projects to each side toward the inside of the through-holes 22. The planar shape of the through-holes 22 may be circular, wherein part of the resist layer 20 projects toward the inside of the through-holes 22. Depressions 36 (see FIG. 5) can be formed in the side of the bumps by forming the projecting sections 24 of the resist layer 20. The through-holes 22 may be formed through the resist layer 20 in the same planar shape in the direction of the thickness of the resist layer 20.

Photolithographic technology may be applied as a method for forming the resist layer 20. Specifically, the photosensitive resist layer 20 may be exposed to energy through a mask (not shown) and subjected to development, thereby forming the through-holes 22. The through-holes 22 can be formed into a specific shape by forming a mask so that the resist layer 20 projects toward the inside of the through-holes 22. The resist layer 20 may be either a positive resist or a negative resist.

The through-holes 22 may be formed into a specific shape by etching the non-photosensitive resist layer 20. The resist layer 20 may be formed by applying screen printing or an ink-jet method insofar as the through-holes 22 are formed into a specific shape.

The through-holes 22 may be formed so as not to cross the circumference of the pads 12, as shown in FIG. 2. This enables the bumps to be formed without causing a short circuit to occur between adjacent pads 12 even if the pitch between each pad 12 is extremely fine. The through-holes 22 may be formed so as to be larger than the circumference of the pads 12. The through-holes 22 may be formed so that part of the circumference thereof intersects the circumference of the pads 12.

Figure 3B:
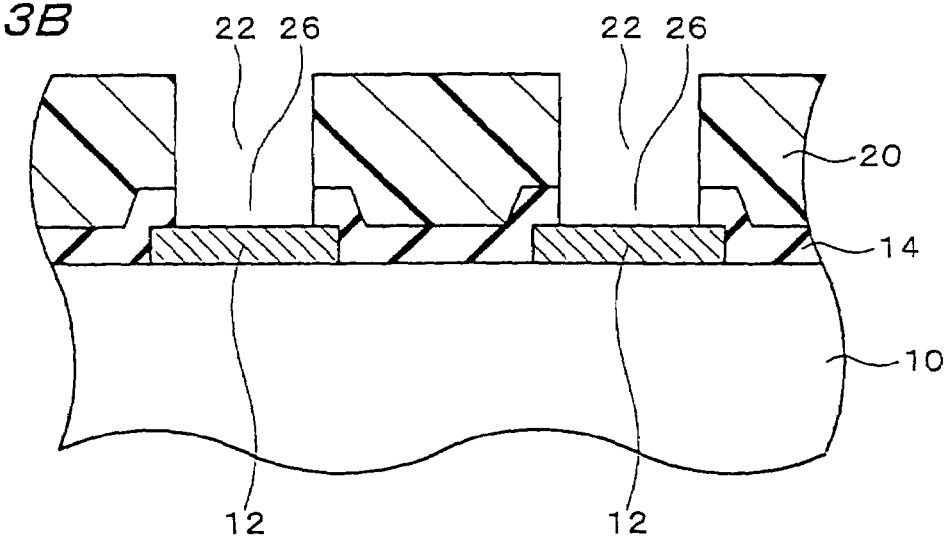

Part of the insulating film 14 is removed through the through-holes 22 formed in the resist layer 20, as shown in FIG. 3B. Specifically, openings 26 for exposing at least part (part or all) of the pads 12 are formed by removing the insulating film 14 in the area inside the through-holes 22. The openings 26 may be formed by etching. The etching technique may be either a chemical or physical technique, or a combination of these techniques. Etching characteristics may be either isotropic or anisotropic. In the case where isotropic etching is applied, the openings 26 in the insulating film 14 may be formed outside the circumference of the through-holes 22. The openings 26 in the insulating film 14 may be formed inside the circumference of the pads 12. The openings 26 in the insulating film 14 may be formed outside the circumference of the pads 12. The size of the exposed area of the pads 12 by the openings 26 is not limited. For example, the exposed area may be in the shape of a square having a side length of about 20 µm.

Figure 3C:
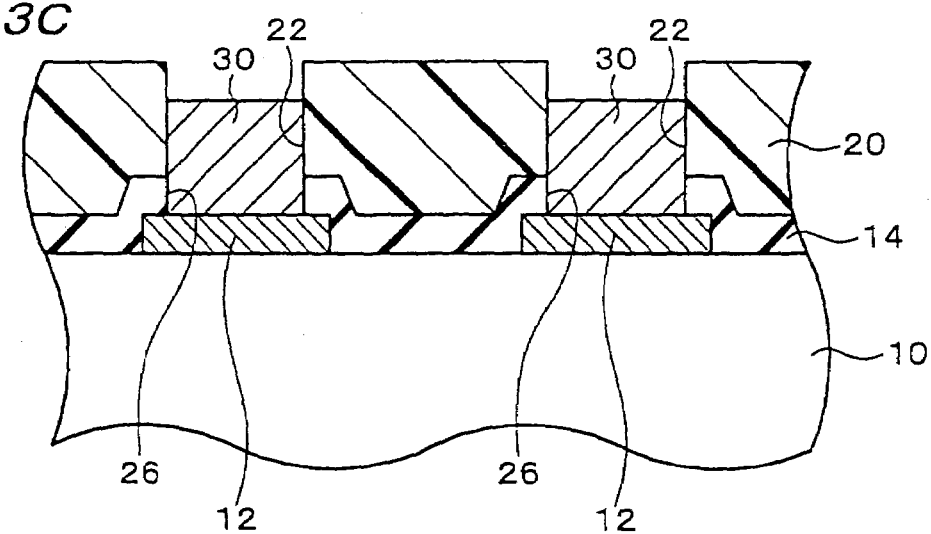

First metal layers 30 are formed conforming to the shape of the through-holes 22, as shown in FIG. 3C. Specifically, the first metal layers 30 are formed along the inner side of the through-holes 22. The through-holes 22 may be completely filled with the first metal layers 30 so that the surfaces of the first metal layers 30 and the resist layer 20 are level. The first metal layers 30 may be either higher than or lower than the surface of the resist layer 20. The first metal layers 30 can be formed into a specific shape by forming the first metal layers 30 along the inner sides of the through-holes 22.

Since the through-holes 22 link with the openings 26 in the insulating film 14, the bumps to be electrically connected to the pads 12 can be formed by forming the first metal layers 30 in the through-holes 22. The first metal layers 30 may be formed of either a single layer as shown in FIG. 3C or a plurality of layers. The first metal layers 30 may be formed using a material containing nickel. Use of nickel layers as the first metal layers 30 enables the bumps to be formed at low cost in a comparatively short period of time. The first metal layers 30 may be formed using a material containing gold.

The first metal layers 30 may be formed by electroless plating. A method for forming the nickel layers (first metal layers 30) on the pads 12 containing aluminum is described below.

The surface (aluminum) of the pads 12 may be replaced by zinc using a zincate treatment. Specifically, aluminum is replaced by zinc by applying an alkaline zinc solution onto the surface of each pad 12. In this case, the semiconductor chip 10 may be dipped into an alkaline zinc solution. It is preferable to heat the resist layer 20 in advance for this treatment at a temperature of about 100-200° C. for several minutes. This provides the resist layer 20 with an increased resistance to a strong alkaline solution. Specifically, the resist layer 20 becomes scarcely soluble. The resist layer 20 may be irradiated with ultraviolet rays in order to prevent heat deformation of the resist layer 20. It is preferable to use ultraviolet rays with a dominant wavelength of 254 nm. The dose may be appropriately adjusted depending on the thickness of the resist layer 20. It is advantageous to irradiate the resist layer 20 with ultraviolet rays while allowing a solvent included in the resist layer 20 to volatile under reduced pressure. It is also advantageous to heat the resist layer 20 and the like at a temperature of about 100-200° C. during irradiation with ultraviolet rays.

It is preferable to dissolve residual insulating films 14 remaining on the semiconductor chip 10 before dipping the pads 12 into an alkaline zinc solution. The residual insulating films 14 may be dissolved by dipping the semiconductor chip 10 into a weak hydrogen fluoride solution. After dissolving the residual insulating films 14, it is preferable to remove oxide films formed in the exposed area of the pads 12 by dipping the pads 12 into an alkaline solution. This enables the surface of the pads 12 to be reliably exposed, whereby aluminum on the surface of the pads 12 can be replaced by zinc.

Zinc may be deposited on the surface of the pads 12 by dipping the pads 12 into an alkaline zinc solution, dissolving zinc by which aluminum is replaced using nitric acid, and further dipping the pads 12 into an alkaline zinc solution. This enables zinc to be reliably deposited on the surface of the pads 12.

The pads 12 are dipped into an electroless nickel solution, thereby forming the nickel layers (first metal layers 30) in the through-holes 22. In this case, the solution may be heated. For example, an electroless nickel solution (4.5 pH) may be heated at a temperature of about 90° C. The semiconductor chip 10 is dipped into this solution for about 45 minutes, thereby forming the nickel layers (first metal layers 30) with a thickness of about 20 μm. The thickness of the first metal layers 30 may be either smaller than or greater than the height of the through-holes 22. The thickness of the first metal layers 30 may be appropriately determined by a period of time for dipping the pads 12 into the solution or the like.

Other metal layers may be interposed between the pads 12 and the first metal layers 30. For example, in the case of forming the first metal layers 30 on the pads 12 by the zincate treatment, part of the zinc layers remaining on the aluminum (pads 12) may be interposed between the first metal layers 30 and the pads 12.

Differing from the above example, a solution containing a reducing agent such as palladium may be applied to the pads 12 and an electroless nickel solution may be applied thereafter, thereby forming the nickel layers (first metal layers 30) with palladium as nuclei.

In the above steps, the first metal layers 30 are formed in the through-holes 22 while allowing the resist layer formed to expose each pad 12 to remain. Specifically, the openings 26 are formed in the insulating film 14 and the first metal layers 30 connected to the pads 12 are formed using the same resist layer 20, whereby the bumps can be formed by simplified steps.

After forming the first metal layers 30, the resist layer 20 is removed, as shown in FIG. 4A. The first metal layers 30 are formed conforming to the shape of the through-holes 22 by the above steps.

Second metal layers 32 may be optionally formed on the surface of the first metal layers 30, as shown in FIG. 4B. The second metal layers 32 may be formed of a single layer as shown in FIG. 4B or a plurality of layers. It is preferable to form the second metal layers 32 conforming to the shape of the first metal layers 30. Specifically, it is preferable to form thin second metal layers 32 so that the depressions in the first metal layers 30 are not filled with the second metal layers 32. The second metal layers 32 may be formed so as to cover the surface of the first metal layers 30. This prevents the surface of the first metal layers 30 from being oxidized. It is preferable to form at least the surface of the second metal layers 32 using a material containing gold.

The second metal layers 32 may be formed by electroless plating. For example, gold layers (second metal layers 32) may be formed on the surface of the nickel layers (first metal layers 30) by dipping the semiconductor chip 10 into an electroless gold plating solution. The thickness of the gold layers (second metal layers 32) is not limited insofar as the gold layers can be formed on the surface of the first metal layers 30. For example, the gold layers (second metal layers 32) may be formed to a thickness of about 0.15 μm.

In the case of forming the first metal layers 30 or second metal layers 32 by electroless plating by dipping the semiconductor chip 10 into a desired solution, it is preferable to cover the side and the back face of the semiconductor chip 10 with a protective film in advance. A resist layer may be used as the protective film. In this case, the resist layer may be a non-photosensitive resist. The resist layer may be formed to a thickness of about 2 μm on the side and the back face of the semiconductor chip 10. Potential changes in each pad 12 of the semiconductor chip 10 caused by dipping the semiconductor chip 10 into the solution can be prevented by thus forming a protective film. Specifically, treatment for each pad 12 such as deposition of a metal by electroless plating can be more uniform.

It is preferable to eliminate light when dipping the semiconductor chip 10 into a desired solution. This prevents the occurrence of potential changes in each pad 12 of the semiconductor chip 10.

Bumps 34 including the first and second metal layers 30 and 32 can be formed in this manner, as shown in FIG. 4C. Brazing materials 40 may be further applied to the second metal layers 32, as shown in FIG. 4C. The soldering or brazing materials 40 are applied to each second metal layer 32. The soldering or brazing materials 40 may be solder. For example, solder balls (soldering or brazing materials 40) may be formed on the bumps 34 by dipping the upper surface of the bumps 34 (part of the second metal layers 32) into a solder bath. Since solder readily adheres to the gold layers (second metal layers 32), solder (soldering or brazing materials 40) can be easily applied to the bumps 34. Solder may be formed using a material containing tin and silver, for example. The height of the solder balls (soldering or brazing materials 40) is not limited. For example, the height of the solder balls may be about 15 μm. In the case of applying the soldering or brazing materials 40 to the semiconductor chip 10, the first and second metal layers 30 and 32 and the soldering or brazing material 40 may be collectively referred to as a bump.

Figure 5:
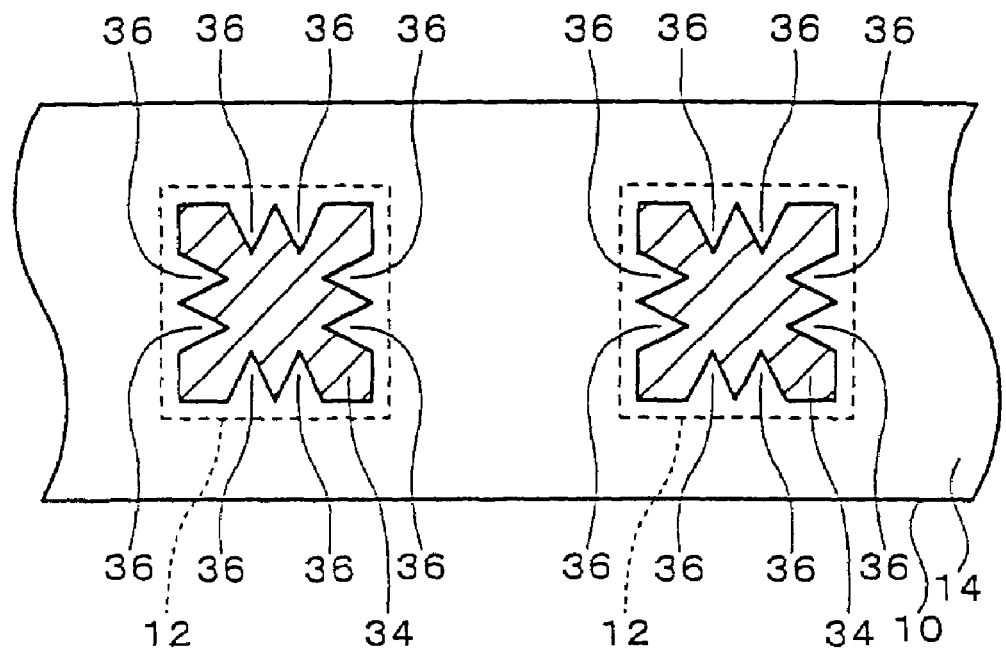
FIG. 5 is a view showing the method for forming bumps according to the first embodiment to which the present invention is applied.

FIG. 5 is a lateral cross-sectional view showing the bumps 34 (first and second metal layers 30 and 32) parallel to the plan view of the semiconductor chip 10. At least one depression 36 (region for receiving soldering or brazing materials 40) is formed on the side of the bumps 34, as shown in FIG. 5. Specifically, part of the first metal layers 30 is made concave by the projecting sections 24 (see FIG. 2) of the resist layer 20 by forming the first metal layers 30 conforming to the shape of the through-holes 22. The second metal layers 32 are formed conforming to the shape of the first metal layers 30. The depressions of the first metal layers 30 are formed as the depressions 36 of the bumps 34.

This allows the soldering or brazing materials 40 to flow into the depressions 36 of the bumps 34 when allowing the soldering or brazing materials 40 to melt on the bumps 34. Since the depressions 36 are formed toward the inside of the bumps 34, the soldering or brazing materials 40 can be absorbed into the inside the bumps 34. This prevents part of the soldering or brazing materials 40 flowing out from the bumps 34 upon melting from spreading in the direction parallel to the surface of the semiconductor chip 10 (lateral direction), whereby the soldering or brazing materials 40 can be absorbed in the direction of the height of the bumps 34 (vertical direction). Therefore, even if each pad 12 is formed at a fine pitch, the soldering or brazing materials 40 can be used without allowing the soldering or brazing materials 40 to flow onto the adjacent pads 12, specifically, without causing a short circuit to occur.

The depressions 36 of the bumps 34 may be formed so that the peak of a triangle faces the center, as shown in FIG. 5. The depressions 36 of the bumps 34 may be formed in the shape of a quadrangle or a semicircle toward the center of the bumps 34. The depressions 36 may be formed in other shapes. In the case where one side of the bumps 34 is about 20 μm and the pitch between each pad 12 is about 40 μm in a plan view of the semiconductor chip 10, the depressions 36 of the bumps 34 may be formed at a depth of about 5 μm from the end sections toward the center. This enables the soldering or brazing materials 40 to be absorbed effectively.

Differing from the example shown in FIG. 5, the depressions 36 of the bumps 34 may be formed only on the sides of the bumps 34 facing the adjacent pads 12 (bumps 34). For example, in the case where the pads 12 are formed in one row in the end sections of the semiconductor chip 10, the depressions 36 may be formed only on the sides of the bumps 34 on each pad 12 facing both adjacent pads 12. This prevents the soldering or brazing materials 40 from spreading in the directions of the adjacent pads 12, thereby preventing occurrence of a short circuit between the pads 12. In the case where each pad 12 is formed in a matrix, for example, the depressions 36 are preferably formed on all sides of the bumps 34.

Figure 6A:
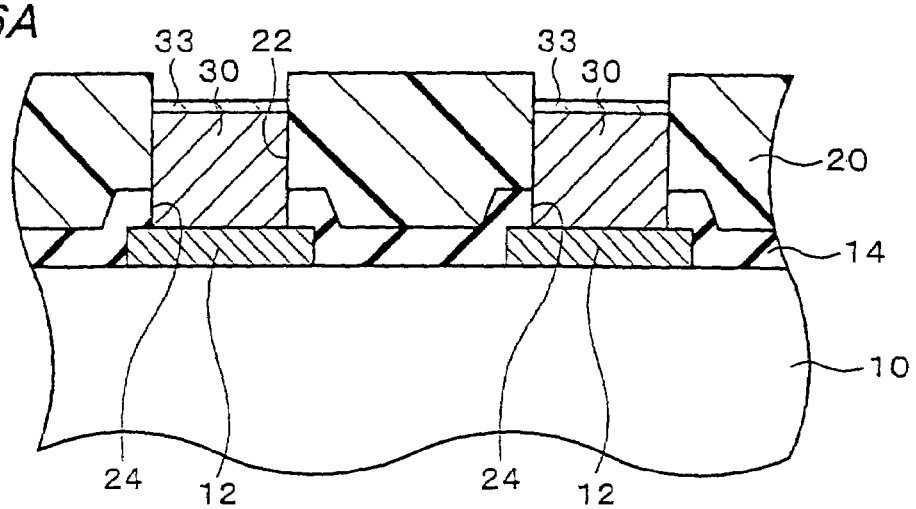
FIGS. 6A to 6C are views showing the method for forming bumps according to a modification example of the first embodiment to which the present invention is applied.
Figure 6B:
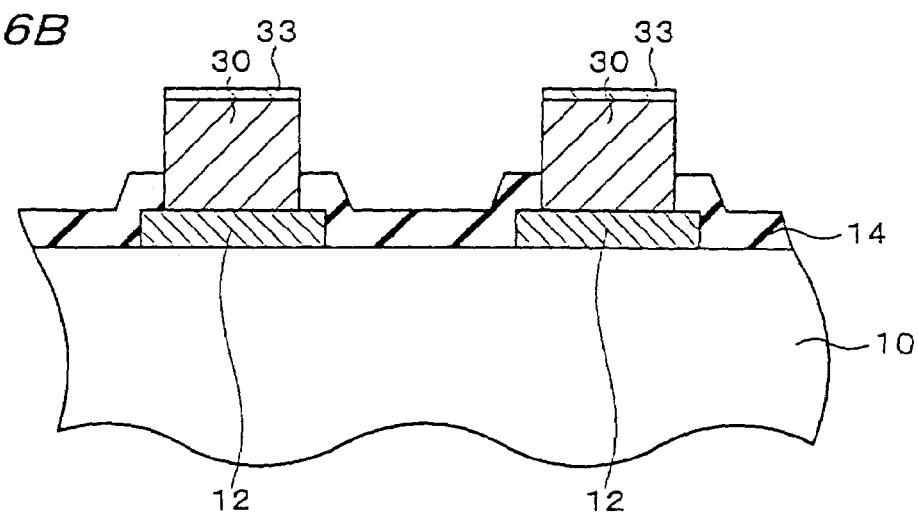
Figure 6C:
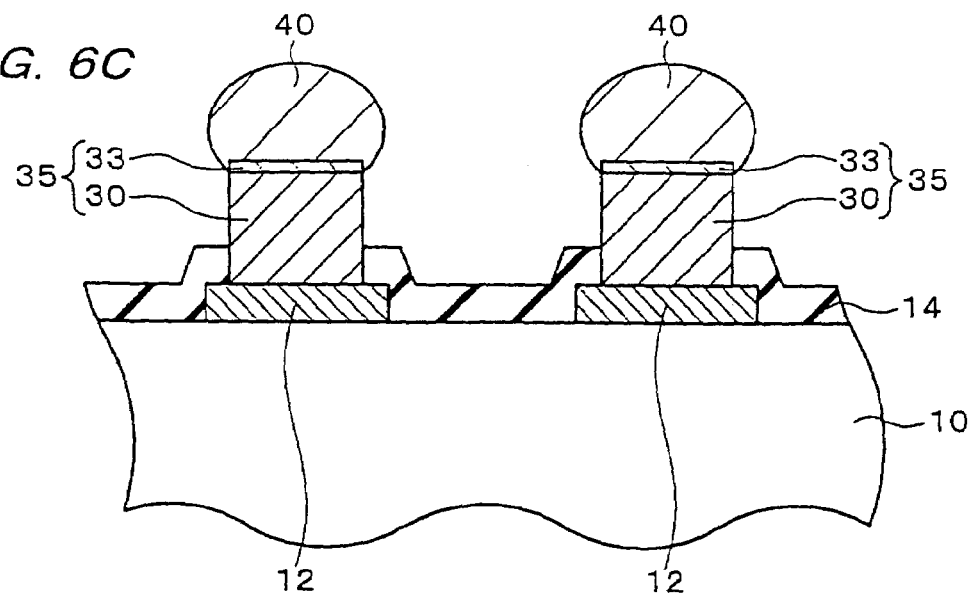

FIGS. 6A to 6C are views showing a method for forming bumps according to a modification example of the present embodiment. This modification example differs from the above-described embodiment as to the structure of second metal layers 33.

The second metal layers 33 are formed in the through-holes 22 formed in the resist layer 20, as shown in FIG. 6A. Specifically, the second metal layers 33 are formed on the upper surface of the first metal layers 30 without removing the resist layer 20. At least the surface of the second metal layers 33 may be formed using a material containing gold. Gold layers (second metal layers 33) may be formed to a thickness of about 0.1 μm. The second metal layers 33 may be formed by electroless plating. Other formation method and structure of the second metal layers 33 are the same as described above.

After forming the second metal layers 33, the resist layer 20 is removed, as shown in FIG. 6B. The first and second metal layers 30 and 33 are formed conforming to the shape of the through-holes 22.

Bumps 35 in which the second metal layers 33 are formed on the upper surface of the first metal layers 30 are formed in this manner, as shown in FIG. 6C. In other words, the bumps 35 include the gold layers (second metal layers 33) only on the upper surface thereof, for example. This enables solder balls (soldering or brazing materials 40) to be formed only on the upper surface of the bumps 35 by dipping the bumps 35 into a solder bath, for example. Specifically, allowing no gold layer (second metal layer 33) to be formed on the side of the bumps 35 more reliably prevents the solder (soldering or brazing material 40) from spreading in the lateral direction from the side of the bumps 35 upon melting.

In the above example, the bumps 34 are formed using the same resist layer 20 used to allow the insulating film 14 to expose each pad 12. Differing from this example, the bumps 34 may be formed by forming another resist layer after removing the resist layer. In this case, through-holes in the resist layer for forming openings in the insulating film 14 which is formed first may be in the shape of either a square or a circle having no depressions. The bumps 34 having the depressions 36 can be formed by forming a resist layer for forming the metal layers (first metal layer 30, for example), which is formed later, so as to have the through-holes 22 formed therein.

According to the method for forming bumps of the present embodiment, the metal layers (bumps 34) are formed into a specific shape conforming to the shape of the through-holes 22. The metal layers (bumps 34) have regions for receiving the soldering or brazing materials 40. This prevents the soldering or brazing materials 40 from spreading outside the metal layers (bumps 34) by allowing the soldering or brazing materials 40 to flow into these regions of the metal layers (bumps 34). Specifically, the soldering or brazing materials 40 melted on the metal layers (bumps 34) can be prevented from flowing onto the adjacent pads 12, for example. Therefore, the yield in the fabrication can be increased by preventing occurrence of a short circuit between the pads 12.

In the case where the pads 12 are formed using a material containing copper, when forming nickel layers (first metal layers 30) on copper, for example, a solution containing a reducing agent such as palladium is applied to the pads 12 and an electroless nickel solution is then applied, thereby forming the nickel layers (first metal layers 30) with palladium as nuclei.

The above metals and solutions are only examples. The present embodiment is not limited thereto. For example, copper may be used as a metal used for electroless plating.

Figure 7:
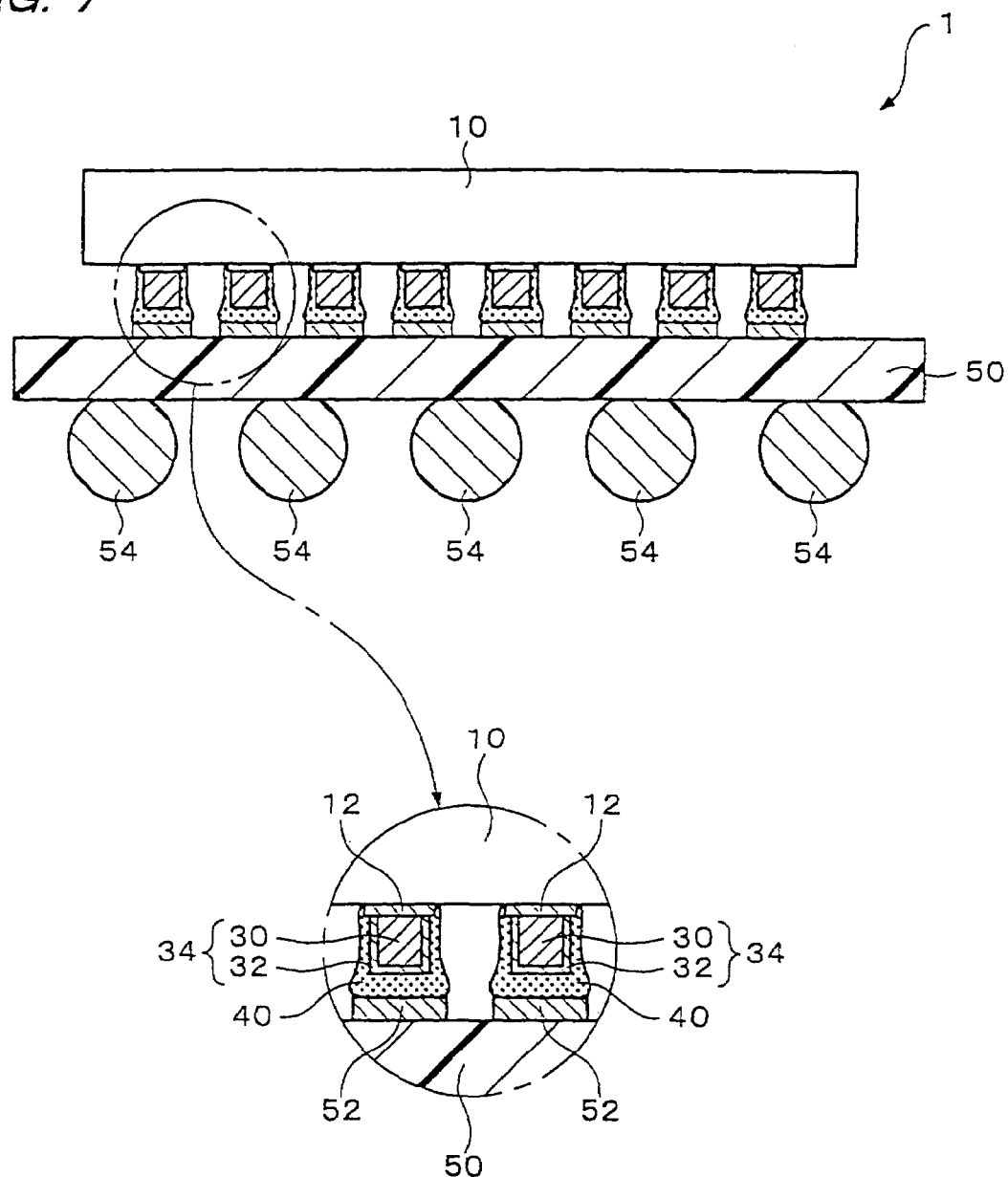
FIG. 7 is a view showing a semiconductor device and a method of fabricating the semiconductor device according to the first embodiment to which the present invention is applied.

A method of fabricating a semiconductor device according to the present embodiment includes a step of bonding the metal layers (first and second metal layers 30 and 32) connected to a plurality of pads 12 of the semiconductor chip 10 to a plurality of leads (interconnect pattern 52) through the soldering or brazing materials 40, as shown in FIG. 7. The metal layers have regions for receiving the soldering or brazing materials 40. The metal layers may be the bumps 34 (first and second metal layers 30 and 32) in which the depressions 36 are formed by the above formation method. Specifically, the regions for receiving the soldering or brazing materials 40 correspond to the depressions 36 of the bumps 34.

Each bump 34 is electrically connected to one of the leads through the soldering or brazing material 40. The leads may be the interconnect pattern 52 formed on a substrate 50. In this case, the semiconductor chip 10 may be bonded face down to the substrate 50. The bumps 34 may be bonded to the lands of the interconnect pattern 52.

The melting soldering or brazing materials 40 are absorbed into the depressions 36 of the bumps 34 when bonding the bumps 34 to the interconnect pattern 52. Specifically, the soldering or brazing materials 40 are allowed to flow into the depressions 36 of the bumps 34 so as not to spread to the adjacent pads 12 (bumps 34). In other words, part of the soldering or brazing materials 40 flowing from the bumps 34 upon melting is prevented from spreading in the direction parallel to the surface of the semiconductor chip 10 (lateral direction) and is absorbed in the direction of the height of the bumps 34 (vertical direction). This prevents occurrence of a short circuit between each pad 12, thereby increasing the yield in the fabrication of the semiconductor device.

The soldering or brazing materials 40 may be applied to the bumps 34 of the semiconductor chip 10, through which the bumps 34 may be bonded to the interconnect pattern 52 (lands). The soldering or brazing materials 40 may be applied to the interconnect pattern 52 (lands) on the substrate 50. The bumps 34 may be bonded to the interconnect pattern 52 (lands) due to surface tension of the soldering or brazing materials 40 during melting.

The leads may be inner leads in the case where the TAB technology is applied, or all conductive members bonded through the soldering or brazing materials 40.

A semiconductor device according to the present embodiment includes the semiconductor chip 10 including a plurality of pads 12, the metal layers (bumps 34) connected to each pad 12, and a plurality of leads (interconnect pattern 52). The metal layers have regions into which the soldering or brazing materials 40 flow. Each metal layer is bonded to one of the leads through the soldering or brazing materials 40. In this case, each metal layer has regions for receiving the soldering or brazing materials 40. The metal layers may be the above bumps 34. Part of the soldering or brazing materials 40 flows into the depressions 36 of the bumps 34. Other structures are the same as described above. The leads may be the interconnect pattern 52 formed on the substrate 50.

External terminals 54 connected to the interconnect pattern 52 may be formed on the substrate 50. For example, the external terminals 54 which are connected to the interconnect pattern 52 through through-holes (not shown) formed in the substrate 50 may be formed. The external terminals 54 may be formed by solder balls. Instead of positively forming the external terminals 54, solder cream may be applied to the interconnect pattern of the circuit board, and the semiconductor device may be mounted on the circuit board due to surface tension during melting.

According to the present embodiment, the soldering or brazing materials 40 can be prevented from spreading outside the metal layers by allowing part of the soldering or brazing materials 40 to flow into the regions (depressions 36) of the metal layers (bumps 34). Specifically, the soldering or brazing materials 40 melted on the metal layers can be prevented from flowing onto the adjacent pads 12. Therefore, a highly reliable semiconductor device can be provided by preventing occurrence of a short circuit between the pads 12.

SECOND EMBODIMENT

FIGS. 8 to 11 are views showing a method for forming bumps according to a second embodiment to which the present invention is applied. The present embodiment differs from the first embodiment as to the formation method and the structure of metal layers (bumps 74). The description relating to the first embodiment may be applied to the following embodiment as far as possible.

Figure 9A:
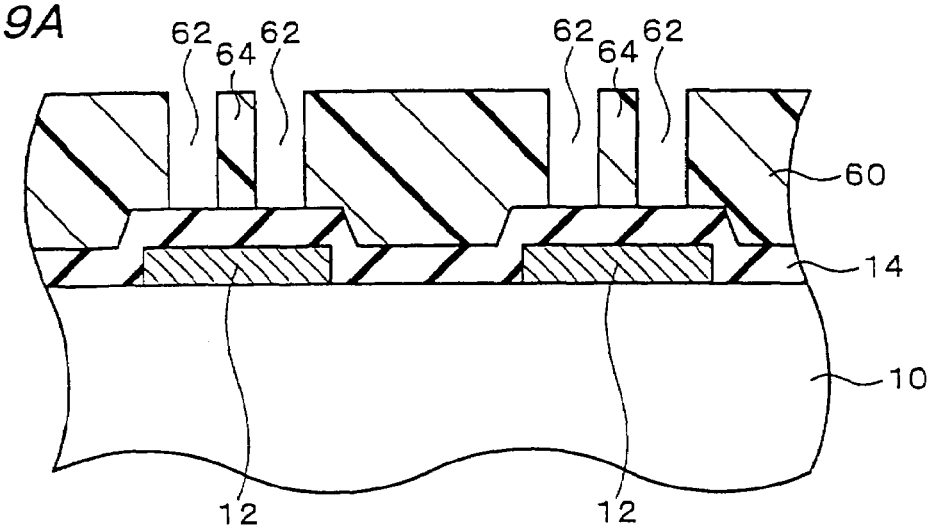
FIGS. 9A to 9C are views showing the method for forming bumps according to the second embodiment to which the present invention is applied.

A resist layer 60 is formed on the semiconductor chip 10, as shown in FIGS. 8 and 9A. The resist layer 60 has a plurality of through-holes 62, at least part (part or all) of which is superposed on one pad 12. A plurality of through-holes 62 may be disposed inside the pads 12 or located outside of the circumference of the pads 12. The resist layer 60 is formed while allowing a portion 64 to remain inside the pads 12 in order to form a plurality of through-holes 62. The shape of the through-holes 62 may be either rectangular as shown in FIG. 8 or circular without specific limitations. The portion 64 of the resist layer 60 is formed to provide a region 76 between metal layers (first and second metal layers 70 and 72) as described later. The portion 64 is formed to a size so as to allow the soldering or brazing material 40 to flow into the region 76. The arrangement and the number of through-holes 62 may be appropriately determined taking into consideration the size which allows the soldering or brazing material 40 to flow into the region 76.

Figure 9B:
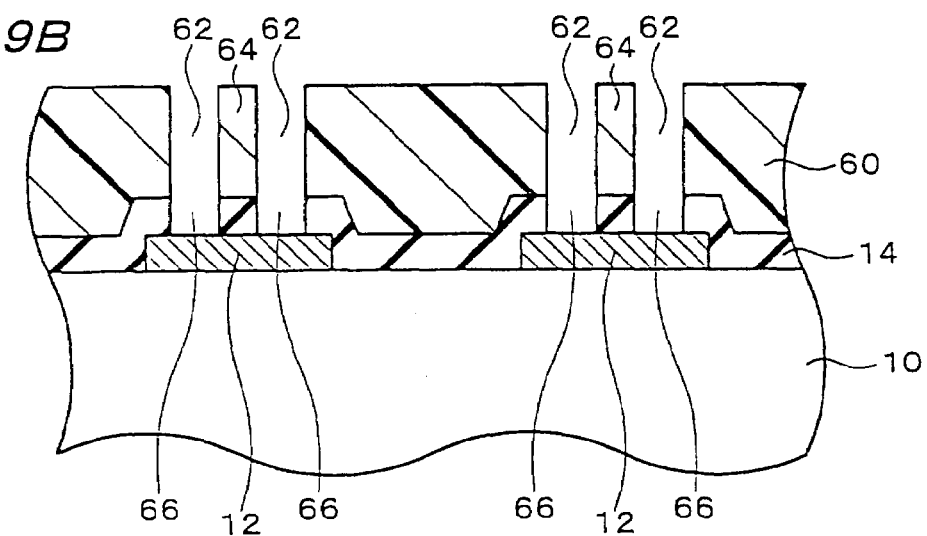

Part of the insulating film 14 is removed through a plurality of through-holes 62 in the resist layer 60, as shown in FIG. 9B. Specifically, a plurality of openings 66 is formed in the insulating film 14 on each pad 12 using the through-holes 62. In other words, a plurality of exposed areas is formed on each pad 12. This enables a plurality of bumps to be formed on each pad 12 so as to be connected to the pads 12. The size of a plurality of exposed areas in each pad 12 is not limited. For example, the exposed area may be in the shape of a square with a side length of about 20 μm.

Figure 9C:
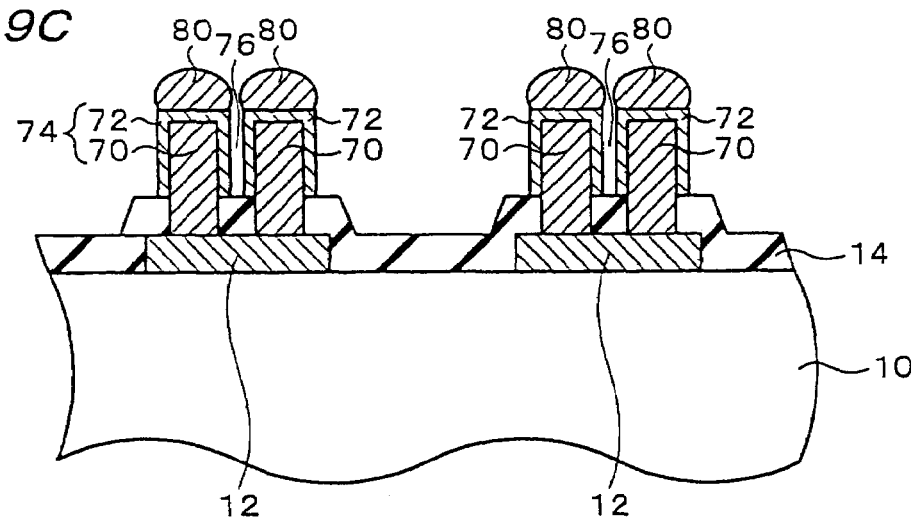

First and second metal layers 70 and 72 are formed as shown in FIG. 9C. For example, the first metal layers 70 may be formed in each through-hole 62. The second metal layers 72 may be formed so as to cover the surface of the first metal layers 70 after removing the resist layer 60. Bumps 74 including the first and second metal layers 70 and 72 are formed in this manner. A plurality of bumps 74 can be formed on each pad 12 by forming a plurality of through-holes 62 for each pad 12.

The region 76 is formed between the adjacent bumps 74 on each pad 12, as shown in FIG. 9C. Specifically, the regions 76 between the bumps 74 are formed by allowing the portions 64 of the resist layer 60 to remain. In the case of forming the second metal layers 72 after removing the resist layer 60, it is preferable to form thin second metal layers 72 so that the regions 76 are not filled with the second metal layers 72.

The formation method and other structures of the first and second metal layers 70 and 72 may be the same as described above. In the present embodiment, the first metal layers 70 may be formed so that at least one depression (see FIG. 5) is formed on the side of the first metal layers 70, as illustrated for the above embodiment.

Brazing materials 80 may be applied to the bumps 74. The soldering or brazing materials 80 may be solder as described above. Solder may be applied to each bump 74 by dipping the bumps 74 into a solder bath, for example. The amount of solder applied to the bumps 74 can be decreased by forming a plurality of bumps 74 on each pad 12, thereby preventing an excess amount of solder from flowing out.

Figure 10:
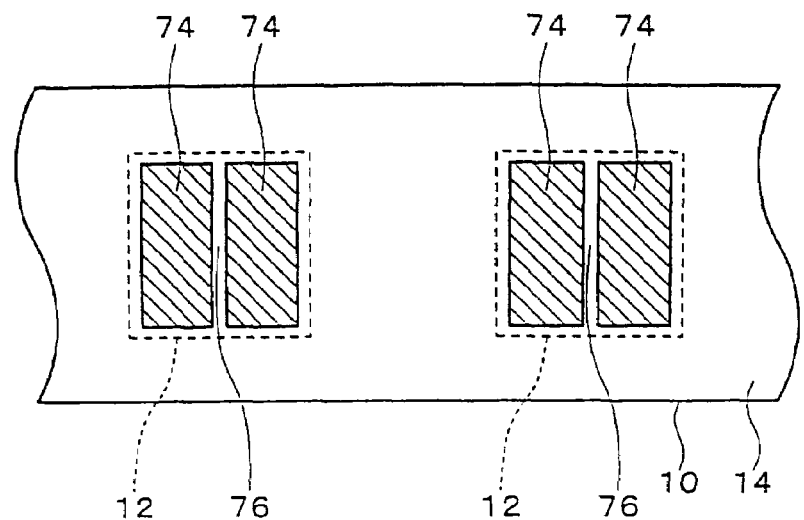
FIG. 10 is a view showing the method for forming bumps according to the second embodiment to which the present invention is applied.

FIG. 10 is a lateral cross-sectional view showing the bumps 74 (first and second metal layers 70 and 72) parallel to a plan view of the semiconductor chip 10. The regions 76 formed between the adjacent bumps 74 on each pad 12 are of a size so as to allow the soldering or brazing materials 80 to flow into the regions 76. The regions 76 may be appropriately determined by the number and arrangement of the through-holes 62 formed in the resist layer 60.

According to the present embodiment, the soldering or brazing materials 80 can be prevented from spreading outside the bumps 74 when allowing the soldering or brazing materials 80 to melt on the bumps 74. Specifically, the regions 76 formed between the adjacent bumps 74 on each pad 12 absorb part of the soldering or brazing materials 80 flowing outside the bumps 74 upon melting. Specifically, the melted soldering or brazing materials 80 can be prevented from spreading in the direction parallel to the surface of the semiconductor chip 10 (lateral direction), and are absorbed in the direction of the thickness of the bumps 74 (vertical direction).

Figure 11:
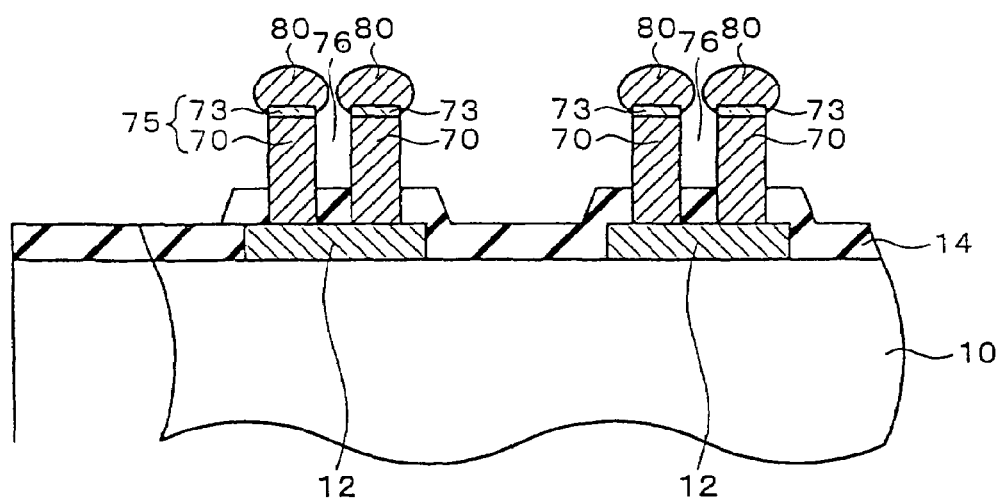
FIG. 11 is a view showing a method for forming bumps according to a modification example of the second embodiment to which the present invention is applied.

FIG. 11 is a view showing a method for forming bumps according to a modification example of the present embodiment. Second metal layers 73 may be formed on the upper surface of the first metal layers 70, as shown in FIG. 11. The second metal layers 73 may be formed using a plurality of through-holes 62 in the resist layer 60. Allowing no gold layer (second metal layer 73) to be formed on the side of the bumps 75 more reliably prevents the melted solder from spreading from the side of the bumps 75 in the lateral direction.

THIRD EMBODIMENT

Figure 12A:
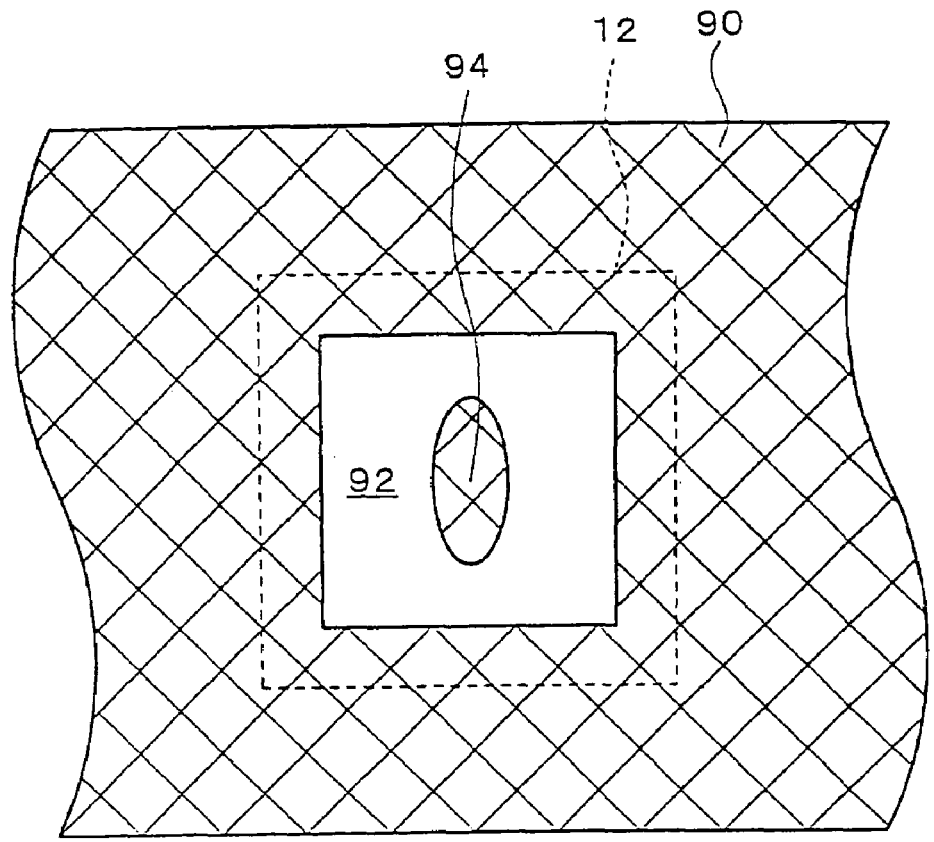
FIGS. 12A and 12B are views showing a method for forming bumps according to a third embodiment to which the present invention is applied.
Figure 12B:
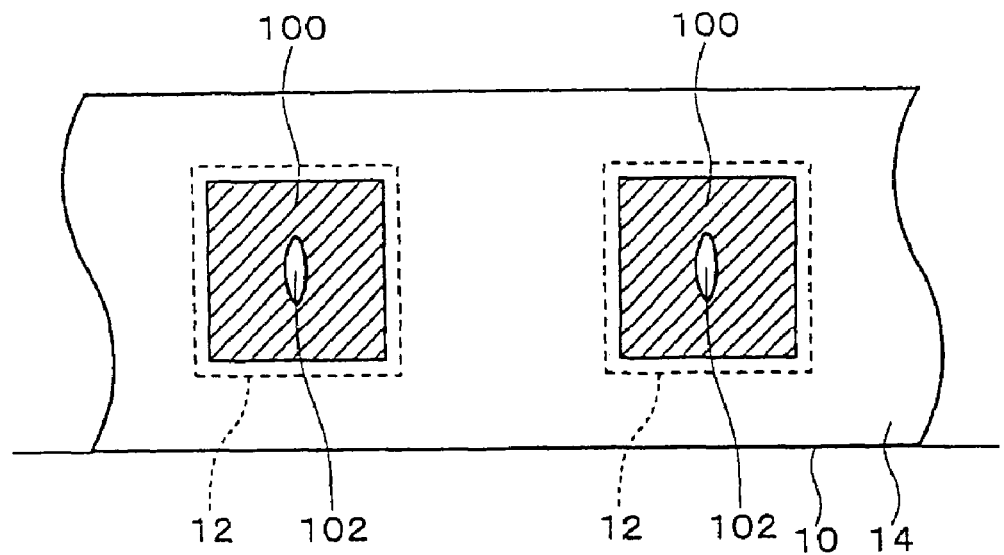

FIGS. 12A and 12B are views showing a method for forming bumps according to a third embodiment to which the present invention is applied. The present embodiment differs from the above embodiments as to the formation method and structure of metal layers (bumps 100).

A resist layer 90 is formed on the semiconductor chip 10, as shown in FIG. 12A. The resist layer 90 is provided with through-holes 92, with at least part (part or all) of each superposed on the pads 12. The through-holes 92 are formed in the resist layer 90 so that part of the resist layer 90 remains at the center of the through-holes 92 in a plan view of the semiconductor chip 10. For example, the through-holes 92 are formed in the shape of a ring which encloses the center (portion 94 of the resist layer 90).

The through-holes 92 may be formed in the shape of either a square ring or a circular ring. The portion 94 of the resist layer 90 forms a region (depression 102) of bumps 100 (including first and second metal layers) formed later. The portion 94 of the resist layer 90 is preferably formed small enough to allow the bumps 100 to be securely connected to the pads 12, but large enough to allow the soldering or brazing materials to flow into the depressions 102 of the bump 100.

FIG. 12B is a lateral cross-sectional view showing the bumps 100 parallel to a plan view of the semiconductor chip 10. The bumps 100 are formed into the shape of a ring so that the depression 102 is formed at the center in a plan view of the semiconductor chip 10. The depressions 102 are formed in the direction of the height of the bumps 100. Part of the pads 12 may be exposed at the bottom of the depressions 102. The shape of the depressions 102 may be either circular or square. Either one or a plurality of depressions 102 may be formed.

According to the present embodiment, part of the soldering or brazing materials flowing outside the bumps 100 upon melting can be absorbed into the depressions 102 of the bumps 100. Specifically, the melted soldering or brazing materials can be absorbed in the direction of the height of the bumps 100 (vertical direction) by preventing the soldering or brazing materials from spreading in the direction parallel to the surface of the semiconductor chip 10 (lateral direction). Moreover, the melted soldering or brazing materials can be prevented from flowing outside in one direction by forming the depressions 102 at the center of the bumps 100. Specifically, an excess amount of soldering or brazing materials can be absorbed uniformly.

Any of the above embodiments may be applied to the present embodiment. Specifically, the bumps 100 may have at least one depression on the side in the present embodiment. A plurality of bumps 100 may be formed on each pad 12. Bumps may be formed by combining these structures.

Figure 13:
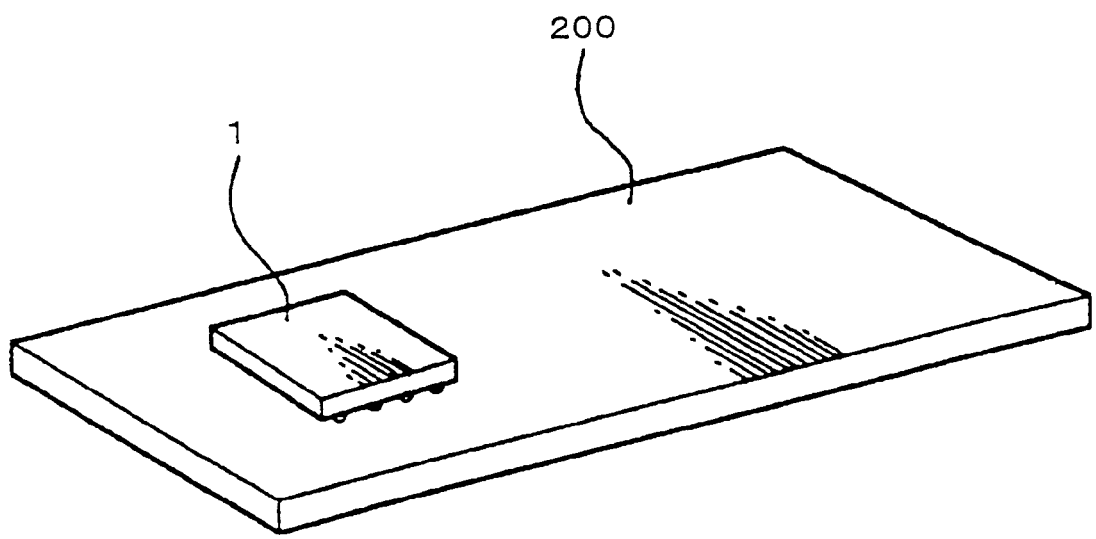
FIG. 13 is a view showing a circuit board equipped with a semiconductor device according to an embodiment to which the present invention is applied.

FIG. 13 shows a circuit board 200 equipped with a semiconductor device 1 according to the present embodiment. The circuit board 200 is generally formed using an organic substrate such as a glass epoxy substrate or a polyimide film or a glass substrate such as a liquid crystal display substrate. An interconnect pattern formed of copper or the like is formed on the circuit board 200 so as to form a desired circuit. The interconnect pattern and the semiconductor device 1 are electrically connected by mechanically connecting the interconnect pattern with the external terminals 54 of the semiconductor device 1.

Figure 14:
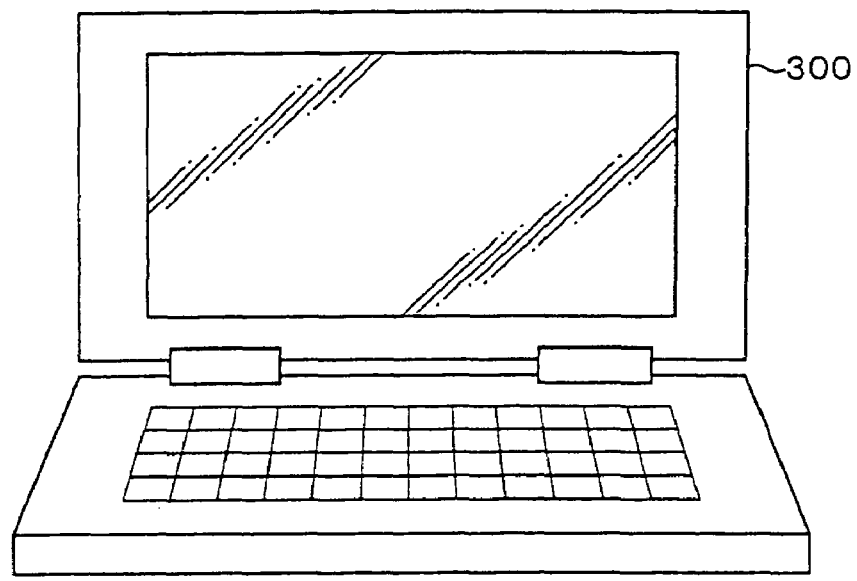
FIG. 14 is a view showing an electronic instrument equipped with a semiconductor device according to an embodiment to which the present invention is applied.
Figure 15:
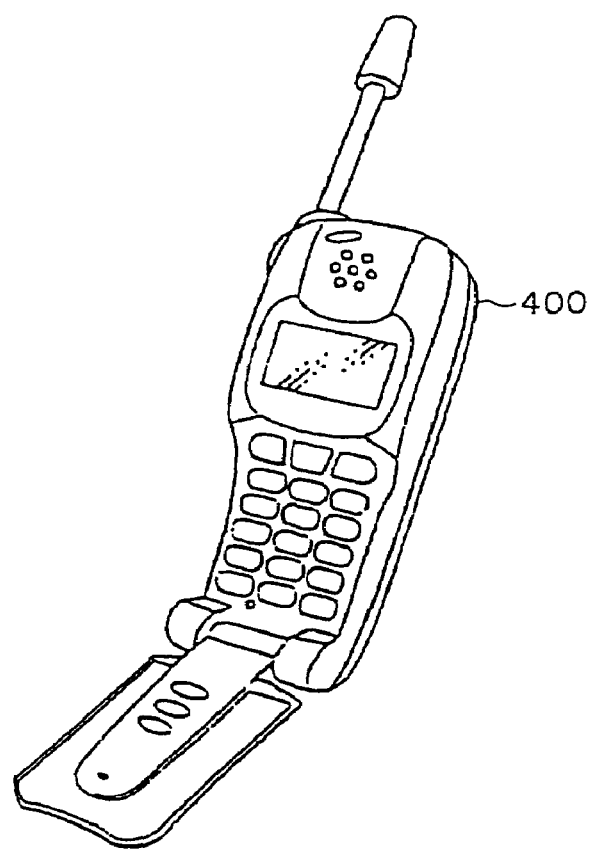
FIG. 15 is a view showing an electronic instrument equipped with a semiconductor device according to an embodiment to which the present invention is applied.

FIGS. 14 and 15 respectively illustrate a notebook-type personal computer 300 and a portable telephone 400 as examples of an electronic instrument equipped with the semiconductor device 1 to which the present invention is applied.

What is claimed is:

1. A semiconductor device comprising:
a semiconductor chips;
a plurality of pads that is formed on a first surface of the semiconductor chip;
a metal layer that is disposed on one of the plurality of pads;
a plurality of leads; and
a soldering or brazing material disposed between the metal layer and one of the plurality of leads,
wherein the metal layer is bonded to the one of the plurality of leads through the soldering or brazing material,
wherein at least one depression is formed in a periphery of the metal layer in a cross-sectional view of the metal layer taken parallel to the first surface of the semiconductor chip, and
the soldering or brazing material is located in the depression.

2. The semiconductor device according to claim 1,
wherein two or more metal layers are formed on the one of the pads, and
the soldering or brazing material is located in a region formed between adjacent metal layers of the two or more metal layers on the one of the pads.

3. A circuit board on which is mounted the semiconductor device according to claim 1.

4. An electronic instrument comprising the semiconductor device according to claim 1.

5. A semiconductor device comprising:
a semiconductor chip;
a plurality of pads that is formed on the semiconductor chip;
a metal layer that is disposed on one of the plurality of the pads, the metal layer having a first surface, a second surface and a third surface, the first surface facing the one the plurality of pads, the second surface being opposite to the first surface, the third surface connecting the first surface and the second surface;
a plurality of leads; and
a soldering or brazing material that is disposed between the metal layer and one of the plurality of leads,
wherein the metal layer is bonded to the one of the plurality of leads through the soldering or brazing material,
wherein at least one depression is formed in the third surface of the metal layer, and
the soldering or brazing material is located in the depression.

6. The semiconductor device according to claim 5,
wherein two or more metal layers are formed on the one of the pads and
the soldering or brazing material is located in a region formed between adjacent metal layers of the two or more metal layers on the one of the pads.

7. A circuit board on which is mounted the semiconductor device according to claim 5.

8. An electronic instrument comprising the semiconductor device according to claim 5.

* * * * *